(12) United States Patent
Kim (10) Patent No.: US 9,281,068 B2
(45) Date of Patent: Mar. 8, 2016

(54) NONVOLATILE MEMORY AND RELATED REPROGRAMMING METHOD

(71) Applicant: SAMSUNG ELECTRONICS CO., LTD., Suwon-Si, Gyeonggi-Do (KR)

(72) Inventor: Tae-Young Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 70 days.

(21) Appl. No.: 14/217,538

(22) Filed: Mar. 18, 2014

(65) Prior Publication Data

US 2014/0351487 A1   Nov. 27, 2014

(30) Foreign Application Priority Data

May 27, 2013   (KR) .................. 10-2013-0059856

(51) Int. Cl.
| | | |
|---|---|---|
| *G11C 16/04* | (2006.01) | |
| *G11C 16/10* | (2006.01) | |
| *G11C 11/56* | (2006.01) | |
| *G11C 16/34* | (2006.01) | |

(52) U.S. Cl.
CPC .......... *G11C 16/107* (2013.01); *G11C 11/5628* (2013.01); *G11C 16/10* (2013.01); *G11C 16/344* (2013.01); *G11C 16/3459* (2013.01)

(58) Field of Classification Search
USPC .............. 365/185.03, 185.19, 185.22, 185.28
See application file for complete search history.

(56) References Cited

U.S. PATENT DOCUMENTS

| | | |
|---|---|---|
| 6,288,935 B1 | 9/2001 | Shibata et al. |
| 6,487,122 B2 | 11/2002 | Shibata et al. |
| RE40,110 E | 2/2008 | Shibata et al. |
| 7,349,249 B2 | 3/2008 | Honma et al. |
| 8,085,587 B2 | 12/2011 | Lim |
| 8,159,882 B2 | 4/2012 | Honma et al. |
| 2010/0142270 A1 | 6/2010 | Shibata |
| 2011/0161571 A1 | 6/2011 | Kim et al. |
| 2012/0020156 A1 | 1/2012 | Choi et al. |
| 2012/0140557 A1* | 6/2012 | Park et al. ................. 365/185.02 |
| 2012/0269002 A1 | 10/2012 | Yoon et al. |
| 2013/0135934 A1* | 5/2013 | Kim et al. ................. 365/185.18 |

FOREIGN PATENT DOCUMENTS

| | | |
|---|---|---|
| JP | 3590270 B2 | 3/2000 |
| JP | 2000-163977 A | 6/2000 |

* cited by examiner

*Primary Examiner* — Hoai V Ho
(74) *Attorney, Agent, or Firm* — Volentine & Whitt, PLLC (57) ABSTRACT

A method of reprogramming a nonvolatile memory device, comprising setting up bit lines of selected memory cells according to logic values of first and second latches of a page buffer connected to the bit lines, supplying a program pulse to the selected memory cells, performing a program verify operation on the selected memory cells using the first and second latches, and performing a predictive program operation on the selected memory cells according to a result of the program verify operation. In the predictive program operation, bit lines of the selected memory cells are setup according to a logic value of a third latch of the page buffer that corresponds to each of the selected memory cells.

20 Claims, 10 Drawing Sheets

NONVOLATILE MEMORY AND RELATED REPROGRAMMING METHOD

CROSS-REFERENCE TO RELATED APPLICATIONS

This application claims priority under 35 U.S.C. §119 to Korean Patent Application No. 10-2013-0059856 filed on May 27, 2013, the subject matter of which is hereby incorporated by reference.

BACKGROUND OF THE INVENTION

The inventive concept relates generally to semiconductor memory devices, and more particularly, to multi-level cell (MLC) nonvolatile memory devices and related reprogramming methods.

Semiconductor memory devices can be roughly divided into two categories according to whether they retain stored data when disconnected from power. These categories include nonvolatile memory devices, which retain stored data when disconnected from power, and volatile memory devices, which lose stored data when disconnected from power.

Flash memory devices are an increasingly popular form of nonvolatile memory devices. Flash memory devices are widely used to various forms of data (e.g., audio and images) in information appliances such as computers, cellular phones, smart phones, PDAs, digital cameras, camcorders, voice recorders, MP3 players, handheld PCs, game consoles, fax machines, scanners, and printers, to name but a few.

There is a general demand for nonvolatile memory devices, including flash memory, with increased storage capacity and performance, as well as lower power consumption. In an effort to achieve higher storage capacity, researchers have developed nonvolatile memory devices capable of storing more than one bit per memory cell, so called MLC devices. The storage of multiple bits per cell, however, tends to reduce the operating margins of the devices, rendering them susceptible to errors. Accordingly, there is ongoing research into operating methods and device improvements to improve the reliability of MLC devices.

SUMMARY OF THE INVENTION

In one embodiment of the inventive concept, a method of reprogramming a nonvolatile memory device comprises setting up bit lines of selected memory cells according to logic values of first and second latches of a page buffer connected to the bit lines, supplying a program pulse to the selected memory cells, performing a program verify operation on the selected memory cells using the first and second latches, and performing a predictive program operation on the selected memory cells according to a result of the program verify operation. In the predictive program operation, bit lines of the selected memory cells are setup according to a logic value of a third latch of the page buffer that corresponds to each of the selected memory cells.

In another embodiment of the inventive concept, a nonvolatile memory device comprises a cell array comprising a buffer area and a main area, wherein data stored in the buffer area is written to the main area by multiple reprogram steps, a row decoder configured to select a wordline of the cell array according to a row address, a page buffer configured to store two-or-more-page data read from the buffer area, wherein the page buffer writes the two-or-more-page data to selected memory cells of the main area based on the reprogram steps, and control logic configured to control the row decoder and the page buffer to perform a verify operation with reference to first-page and second-page data and to program three-or-more-page data with reference to third-page data in a first of the reprogram steps.

These and other embodiments of the inventive concept may decrease a number of program pulses required in a reprogram operation and thus increase a programming speed of a nonvolatile memory device. They may also use time corresponding to the decrease of the program pulse for improving threshold voltage distributions and thus enhance a read margin.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, certain embodiments are described with respect to a flash memory device. However, the inventive concept can be applied to other forms of nonvolatile memory devices, such as PRAM, MRAM, ReRAM, FRAM, NOR flash memory, and others.

Figure 1:
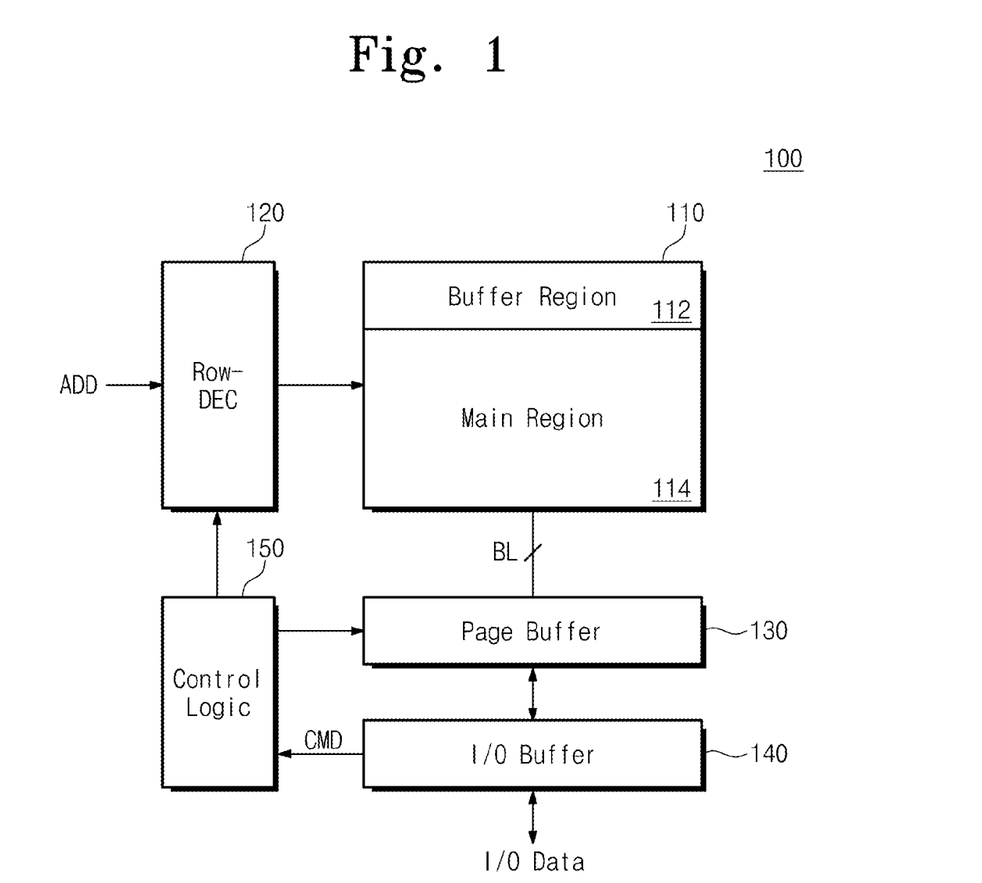
FIG. 1 is a block diagram of a nonvolatile memory device according to an embodiment of the inventive concept.

FIG. 1 is a block diagram of a nonvolatile memory device 100 according to an embodiment of the inventive concept.

Referring to FIG. 1, nonvolatile memory device 100 comprises a cell array 110 having a buffer area 112 and a main area 114. Nonvolatile memory device 100 programs data stored in buffer area 112 to main area 114. Such a programming operation is referred to as an OBP operation.

Cell array 110 is connected to a row decoder 120 through wordlines (WLs) and selection lines SSL or GSL. Cell array 110 is connected to a page buffer 130 through a bit line BL. Cell array 110 comprises multiple NAND cell strings.

In a program operation of nonvolatile memory device 100, data is first written to buffer area 112 and then programmed to main area 114. An operation programming data to buffer area 112 is referred to as buffer programming and an operation programming data to main area 114 is referred to as main programming. The main programming may be implemented in various schemes. For example, it may be implemented by a reprogram scheme comprising multiple steps (e.g., 3 steps) to program multiple pages.

A reprogram operation is performed according to address information related to stored data. As an example, a minimum program unit for buffer area 112 and a minimum program unit for main area 114 may be determined in various ways according to a program scheme, the number of data bits stored per cell, etc. According to an embodiment of the inventive concept, a minimum program unit for buffer area 112 and the minimum program unit for main area 114 are different from each other.

Memory areas 112 and 114 may comprise logical and/or physical units of organization. Memory blocks belonging to buffer area 112 may be programmed different from memory blocks belonging to main area 114. For example, memory blocks belonging to buffer area 112 may be programmed according to a single level cell (SLC) program scheme, while memory blocks of main area 114 may programmed according to an MLC or triple level cell (TLC) program scheme. Alternatively, memory blocks of buffer area 112 and memory blocks belonging to main area 114 may both be programmed according to the MLC program scheme. For example, each of the memory cells of buffer area 112 may store M-bit data (M>1) and each of the memory cells belonging to main area 114 may store N-bit data (N>M).

Row decoder 120 selects one of the memory blocks of cell array 110, and a wordline among the selected memory block, in response to an address ADD. Row decoder 120 delivers a wordline voltage VWL to wordlines of the selected memory block. Row decoder 120 delivers selection signals to the selection lines (e.g., SSL or GSL) of the selected memory block. Row decoder 120 delivers a program voltage Vpgm and a verify voltage VR to a selected wordline WL and a pass voltage Vpass to an unselected WL.

Page buffer 130 operates as a write driver or a sense amplifier according to an operation mode. In a program operation, page buffer 130 delivers a bit line voltage corresponding to data to be programmed to the bit line of cell array 110. In write operation, page buffer 130 senses data stored in the selected memory cell through a bit line. Page buffer 130 may latch and output the sensed data to the outside.

Page buffer 130 reads two-or-more-page data from buffer area 112 in reprogram operation. In addition, page buffer 130 reprograms the read two-or-more-page data to main area 114. In reprogram operation to main area 114, page buffer 130 stores and reconfigures the read data in internal latches. Memory cells selected by the reconfigured data are programmed.

An input and output (I/O) buffer 140 delivers write data to page buffer 130 in a write operation. I/O buffer 140 outputs read data provided from page buffer 130 in read operation. I/O buffer 140 delivers an input address or command to a control logic 150 or row decoder 120.

Control logic 150 controls row decoder 120 or page buffer 130 in response to command CMD or address ADD delivered from I/O buffer 140. Control logic 150 performs a control operation for accessing a selected memory area in response to a write, read, or erase command that is provided through I/O buffer 140. Control logic 150 may control row decoder 120 and page buffer 130 to perform a reprogram operation in response to an external command.

Control logic 150 programs two-or-more-page data read from buffer area 112 to a target area of main area 114 according to a main programming procedure. In this case, reprogram operations comprising at least three steps may be performed in the main programming procedure. The number of target threshold voltage distributions of memory cells that are formed by each of the reprogram operations comprising at least three steps is the same. For example, in a case where memory cells selected for the main programming operation are the TLCs, the memory cells are programmed to have eight threshold voltage distributions at each of the reprogram steps. In particular, the memory cells selected in first-step reprogram operation may be programmed to have eight threshold voltage distributions at first.

Nonvolatile memory device 100 may program memory cells selected in the first step of the main programming operations so that they have eight or more threshold voltage distributions. Thus, it is possible to reduce a time taken for main programming. Alternatively, it is possible to use a time secured through the time reduction in the main programming operation to increase a write margin. Thus, nonvolatile memory device 100 may increase a main programming speed or improve data integrity.

Figure 2A:
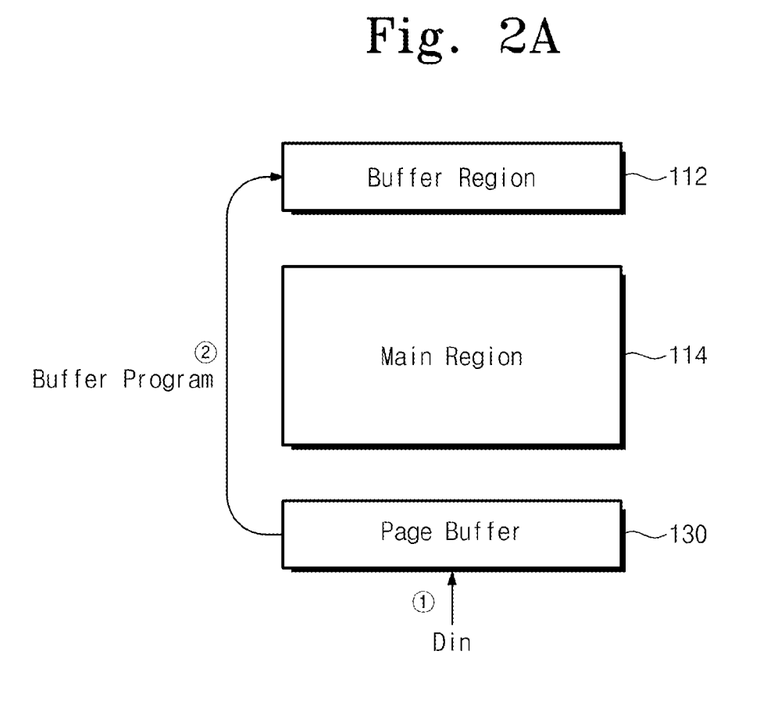
FIG. 2A is a block diagram of an on-chip buffered program (OBP) operation performed on the nonvolatile memory device of FIG. 1, according to an embodiment of the inventive concept.
Figure 2B:
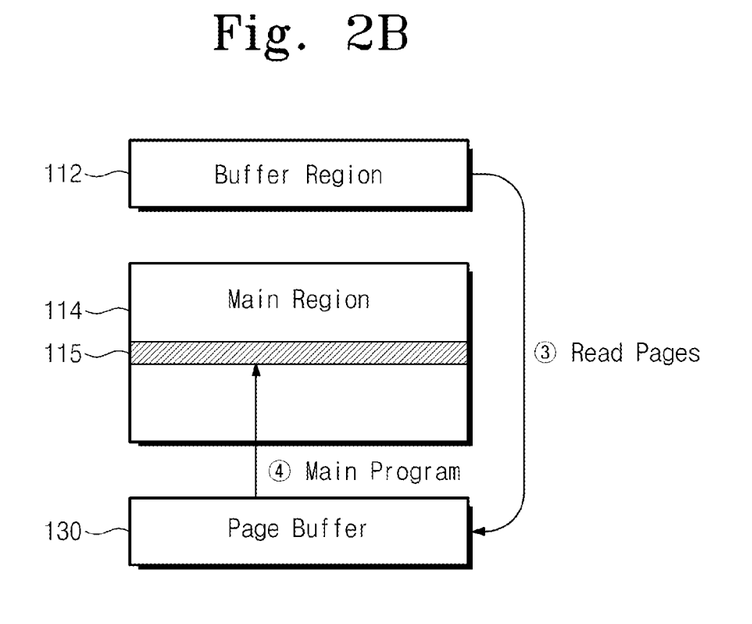
FIG. 2B is another block diagram of the OBP operation performed on the nonvolatile memory device of FIG. 1, according to an embodiment of the inventive concept.

FIGS. 2A and 2B are block diagrams of an OBP operation performed on the nonvolatile memory device of FIG. 1, according to an embodiment of the inventive concept. FIG. 2A shows a buffer program operation and FIG. 2B shows a main program operation.

Referring to FIG. 2A, nonvolatile memory device 100 programs write data to buffer area 112. Memory cells assigned to buffer area 112 may be used as SLCs. Thus, 1-bit data is stored in each of memory cells corresponding to buffer area 112. A write speed or data integrity to and for buffer area 112 used as the SLC is relatively higher than that of main area 114 managed as the MLC or TLC. Thus, the speed of a buffer program operation in which data is written to buffer area 112 is relatively higher.

Write data is input from the outside for a buffer program operation. The write data is first loaded to page buffer 130. A path through write data input from the outside is loaded to page buffer 130 is represented as a data path (①). Write data is input from the outside on a page basis for the buffer program.

Write data stored in page buffer 130 is programmed to buffer area 112. If page-based (e.g., 2 KB) data is loaded to page buffer 130, page buffer 130 programs the loaded data to buffer area 112. In this case, the data programmed to buffer area 112 may be written using the SLC scheme. Alternatively, the number of bits stored per cell of memory cells of buffer area 112 is the same as that of memory cells of main area 114 but management may be made to store only 1-bit data per cell. In this way, two-or-more-page data may be programmed to buffer area 112. Such a program procedure is represented as a data path (②).

Here, the number of bits stored per cell of memory cells in buffer area 112 may be 1 or more bits. However, the number of bits per cell of memory cells of buffer area 112 is less than that of memory cells in main area 114.

Referring to FIG. 2B, a main program procedure in which data stored in buffer area 112 is again programmed to main area 114 is shown. For two-or-more-page data stored in the buffer area 112 to be programmed to a target area of the main area 114, a read operation on the buffer area 112 needs to be first performed. Thus, two or more pages stored in the buffer area 112 are sensed by page buffer 130. Such an operation is shown as a data path (③). The sensed two-or-more-page data is stored in multiple latches (not shown) that is included in page buffer 130. A read operation on the buffer area 112 is controlled by an external command of nonvolatile memory device 100.

If the buffer area 112 is completely read, nonvolatile memory device 100 receives a write command for programming the read pages to the main area 114. The write command comprises a target address that corresponds to a target area 115. In this case, page buffer 130 programs multiple pages to the target area using the MLC scheme. For example, the pages read from buffer area 112 may be programmed at a time. In addition, page buffer 130 may perform such a main program operation through a reprogram procedure that comprises multiple steps. Such a procedure is represented as a data path (④).

Although it is described above that buffer area 112 is managed according to the SLC scheme, the inventive concept is not limited thereto. For instance, the inventive concept may be applied to nonvolatile memory devices in which the number of bits stored per cell of buffer area 112 is less than that of main area 114. In addition, the minimum program unit for buffer area 112 and the minimum program unit for the main area 114 may be determined in various ways according to a program scheme, the number of bits stored per cell, etc. According to an embodiment of the inventive concept, a minimum program unit for the buffer area 112 and a minimum program unit for the main area 114 are different from each other.

Figure 3A:
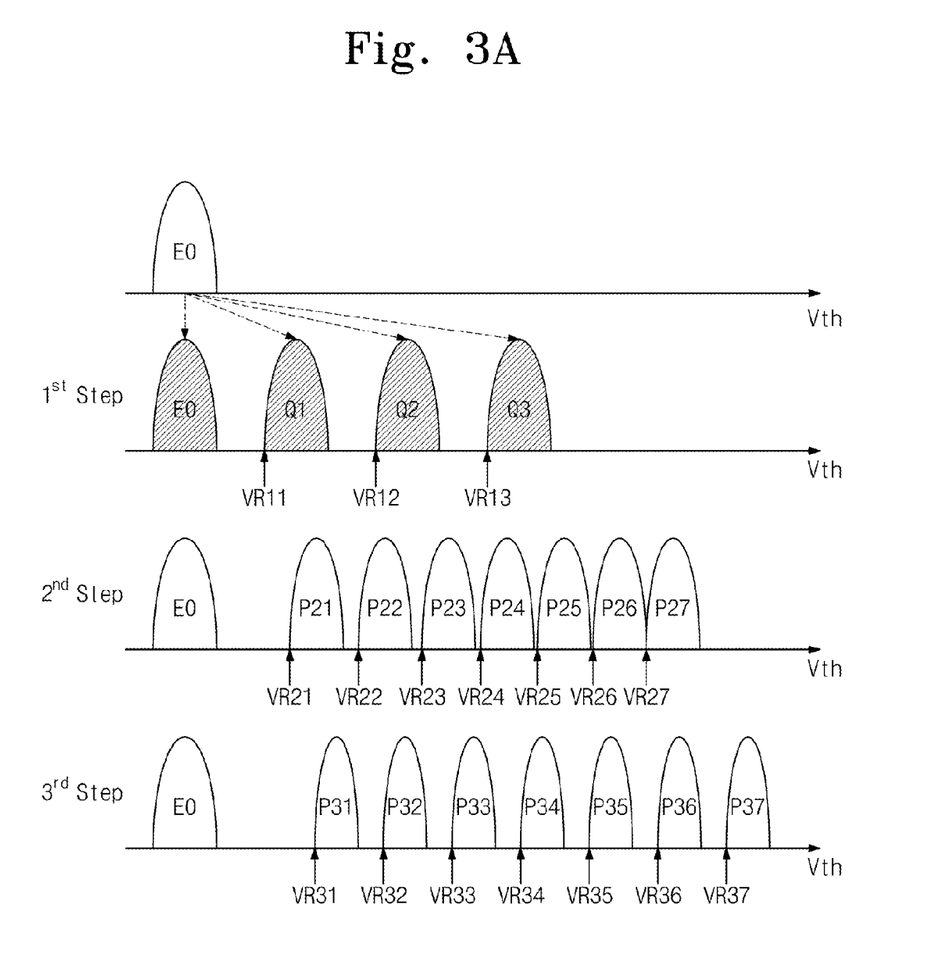
FIG. 3A is a graph illustrating threshold voltage distributions for memory cells programmed by a method according to an of the inventive concept.
Figure 3B:
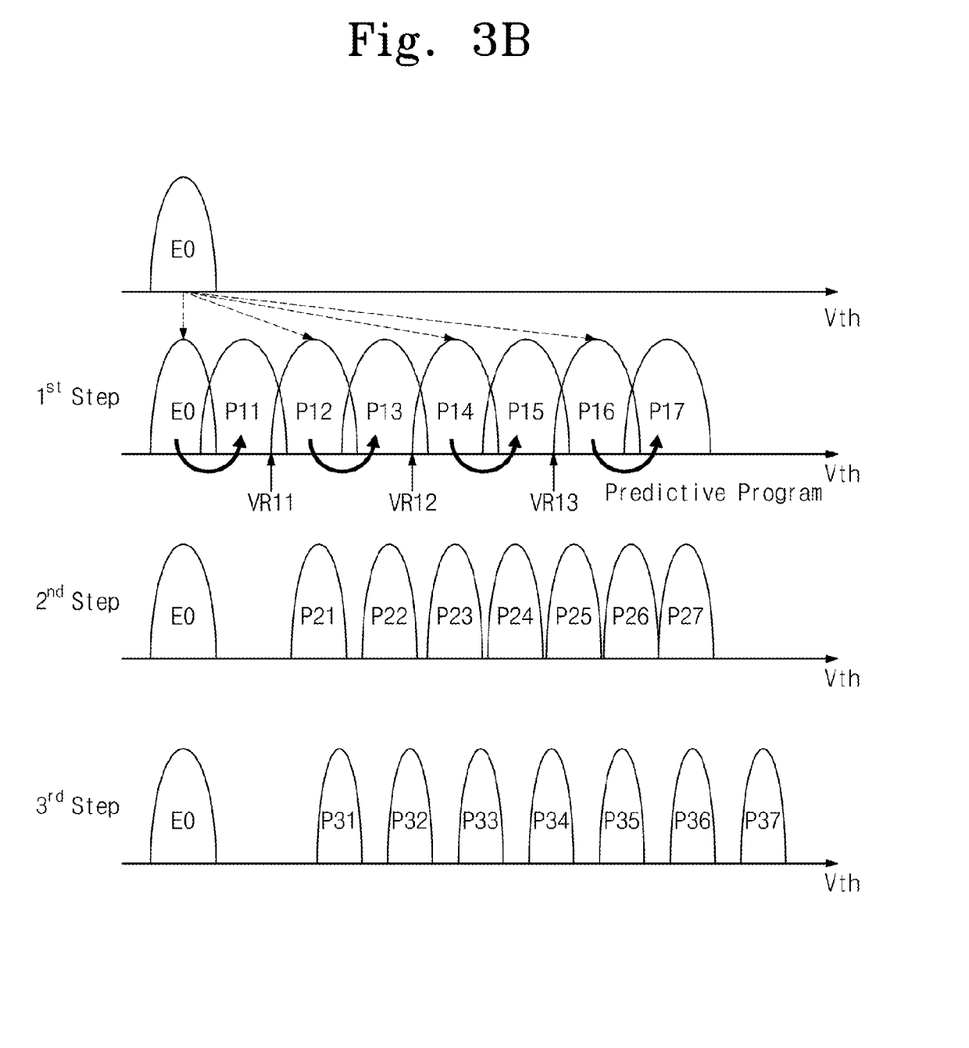
FIG. 3B is another graph illustrating threshold voltage distributions for memory cells programmed by the method of FIG. 3A, according to an of the inventive concept.

FIGS. 3A and 3B show threshold voltage distributions of memory cells that are formed in operation of a main program performed in a reprogram scheme. A case where memory cells of main area 114 are the TLCs is presented for explanation purposes. However, memory cells of main area 114 may alternatively be cells that store 4 or more bits per cell.

FIG. 3A shows an example where 2-bit data is programmed to each of memory cells in first-step reprogram operation. In addition, 3-bit is programmed to each of memory cells in second-step and third-step reprogram operations. That is, the threshold voltages of memory cells in first-step reprogram operation will form four distributions E0, Q1, Q2, Q3.

First, two-page data, i.e., first-page and second-page data, is stored in memory cells 115 (see FIG. 2B) selected in first-step reprogram. Before the first-step reprogram, selected memory cells have a threshold voltage that corresponds to an erase state E0. The selected memory cells have at least one of four distributions E0, Q1, Q2, Q3 according to the execution of the first-step reprogramming.

During the first-step reprogram operation, program voltage Vpgm and verify voltages VR11 to VR13 are provided to the wordline of the selected memory cells. The program completion of memory cells reprogrammed to a threshold voltage corresponding to distribution Q1 is determined by verify voltage VR11. The program completion of memory cells reprogrammed to a threshold voltage corresponding to distribution Q2 is determined by verify voltage VR12. The program completion of memory cells reprogrammed to a threshold voltage corresponding to distribution Q3 is determined by verify voltage VR13.

Where the first-step reprogram operation is completed, selected memory cells 115 are programmed to eight distributions E0 and P21 to P27 according to a second-step reprogram operation. That is, 3-bit data is written to selected memory cells since the second-step reprogram operation. During the second-step reprogram operation, program voltage Vpgm and verify voltages VR21 to VR27 are provided to the wordline of selected memory cells. It is determined whether the threshold voltage of each of the selected memory cells is changed to the target distributions P21 to P27 by the verify voltages VR21 to VR27. Here, verify voltages VR21 to VR27 are voltages to be programmed to the target distributions P21 to P27 that do not consider a read margin. Thus, 3-bit data is coarse-programmed to memory cells selected through the second-step reprogram.

During the third-step reprogram operation, a fine program for securing a read margin is performed. That is, program data set to page buffer 130 in third-step reprogram operation is the same as the program data in second-second reprogram operation. However, verify voltages VR31 to VR37 are applied to the wordline of selected memory cells in the third-step reprogram operation. The threshold voltage of selected memory cells is formed as the distributions E0 and P31 to P37 by the verify voltages VR31 to VR37. Selected memory cells may secure a read margin through the third-step reprogram operation.

A main program scheme in which selected memory cells form four distributions E0 and Q1 to Q3 in first-step reprogram operation and eight distributions in second-step and third-step reprogram operations has been described above. Such a main program scheme is also referred to as a '4-8-8' reprogram scheme.

Referring to FIG. 3B, a main program procedure according to an embodiment of the inventive concept is shown. Here, a '8-8-8' reprogram scheme in which 3-bit data is programmed in each of first-step to third-step reprogram operations is exemplified.

First, a first-step reprogram operation in which 3-page data is stored in the memory cells of a selected wordline is performed. The threshold voltage of selected memory cells will have a value corresponding to any one of eight states E0 and P11 to P17, through the first-step reprogram operation. The distribution of the threshold voltage of the memory cells formed by the first-step reprogram operation may be relatively wide. This is because the distribution may subsequently widen under the influence of adjacent memory cells, according to such a program scheme.

According to the first-step reprogram operation of the inventive concept, while multiple program loops are performed, a verify operation is performed by verify voltages VR11 to VR13. Each program loop of the first-step reprogram operation detects only whether a program to three target distributions P12, P14, and P16 is completed. That is, in the first-step reprogram operation, a program verify operation is activated on 2-bit data. However, in the last loop of the first-step reprogram operation, a predictive program for memory cells corresponding to target distributions P11, P13, P15, and P17 is performed. A separate program verify operation is skipped in the predictive program.

In second-step and third-step reprogram operations following the first-step reprogram operation, a program operation for securing a read margin or increasing a program speed may be performed. For example, the increase width of a program pulse may increase to improve the program speed. In this case, it is possible to achieve a high program speed. On the other hand, operations for sufficiently securing a read margin may be performed in second-step and third-step reprogram operations. For example, it is possible to increase the number of program loops by decreasing the increase width of a program pulse. However, time taken for second-step and third-step reprogram operations will sharply decrease by eight threshold voltage distributions secured in first-step reprogram operation. In this case, it is possible to achieve high data integrity.

According to a reprogram scheme as described above, it is possible to obtain an effect of programming 3-bit data by using a verify scheme in which 2-bit data is programmed in a memory cell, in first-step reprogram operation. Thus, it is possible to dramatically decrease the load of programming in following second and third steps.

Figure 4:
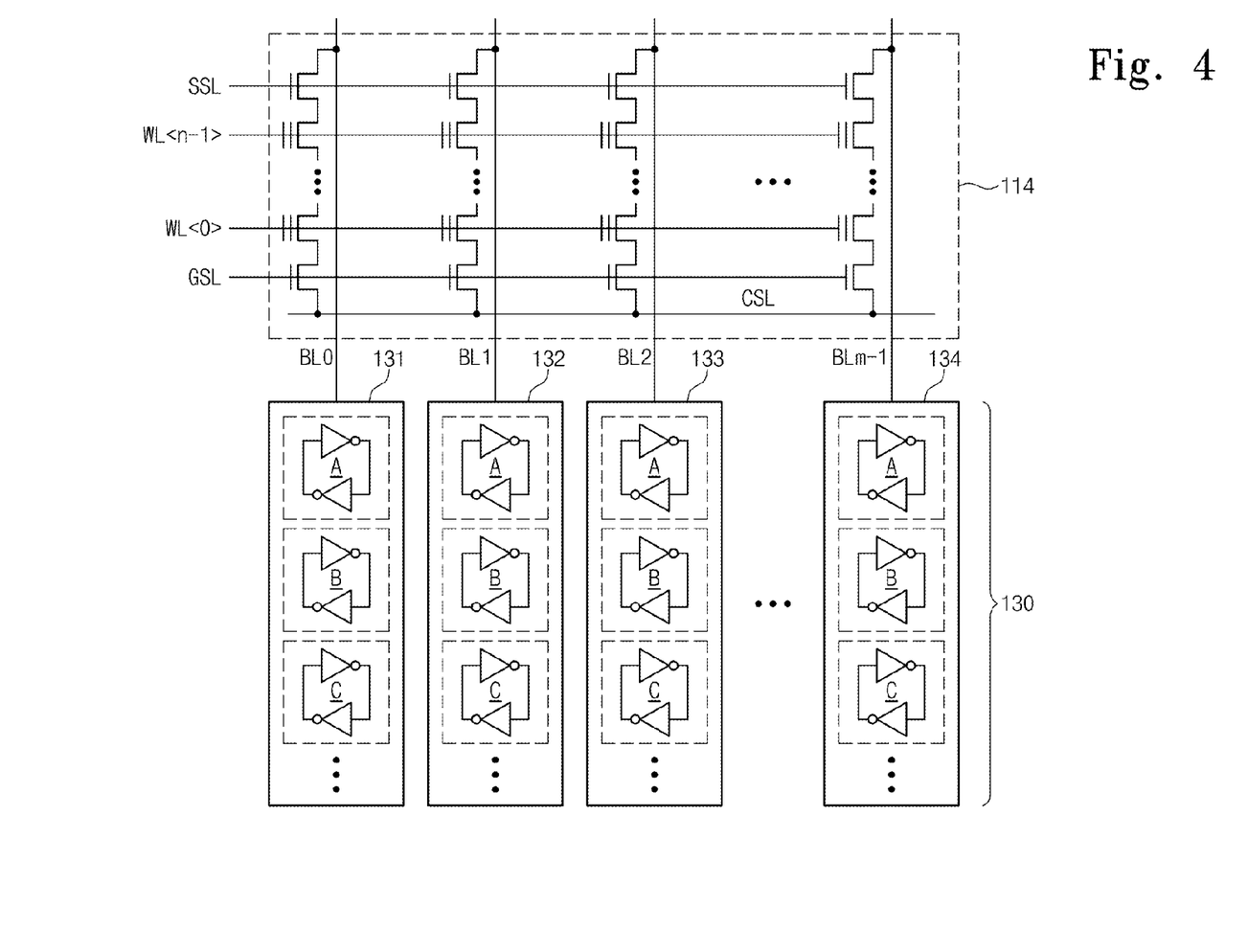
FIG. 4 is a block diagram of a page buffer according to an embodiment of the inventive concept.

FIG. 4 is a block diagram of a page buffer 130 according to an embodiment of the inventive concept.

Referring to FIG. 4, page buffer 130 comprises multiple page buffer circuits 131, . . . , 134 that are respectively connected to bit lines BL0 to BLm−1.

Main area 114 comprises multiple memory blocks. Although main area 114 is shown as one memory block, the illustrated structure may apply to other memory blocks. It will be assumed that memory cells connected to a wordline WL<0> are selected for a main program operation. Then, 3-page data that is loaded to page buffer 130 is programmed to selected memory cells by first-step to third-step reprogram operations.

Each of page buffer circuits 131, . . . , 134 comprises multiple latch A, latch B, latch C, etc. In buffer program or main program operation, data to be programmed is loaded to latches of each of page buffer circuits 131, . . . , 134. For the main programming operation, two-or-more-page data is sensed from buffer area 112 and sequentially stored in latches A to C of each of page buffer circuits 131, . . . , 134. For example, a first page (page1) stored in buffer area 112 is sensed and stored in latch A of each of page buffer circuits 131, . . . , 134. A second page (page2) stored in buffer area 112 is sensed and stored in latch B of each of page buffer circuits 131, . . . , 134. A third page (page3) stored in buffer area 112 is sensed and stored in latch C of each of page buffer circuits 131, . . . , 134. Each of page buffer circuits 131, . . . , 134 comprises additional latch circuits such as a sensing latch, a cash latch, etc. but a related description is herein skipped.

In first-step reprogram operation, each of the selected memory cells is identified as any one of four states according to bits stored in two latch A and latch B among latches A, B, C, etc. That is, selected memory cells are classified into groups selected for verify read operations by each of verify voltages VR11 to VR13. In addition, in the last loop of the first-step reprogram operation, each of the selected memory cells may be predictive-programmed according to a bit value stored in latch C. That is, the bit line of the selected memory cells is setup according to a bit stored in latch C. In addition, the threshold voltage of the selected memory cells will form approximately eight distributions by the last program pulse.

Figure 5:
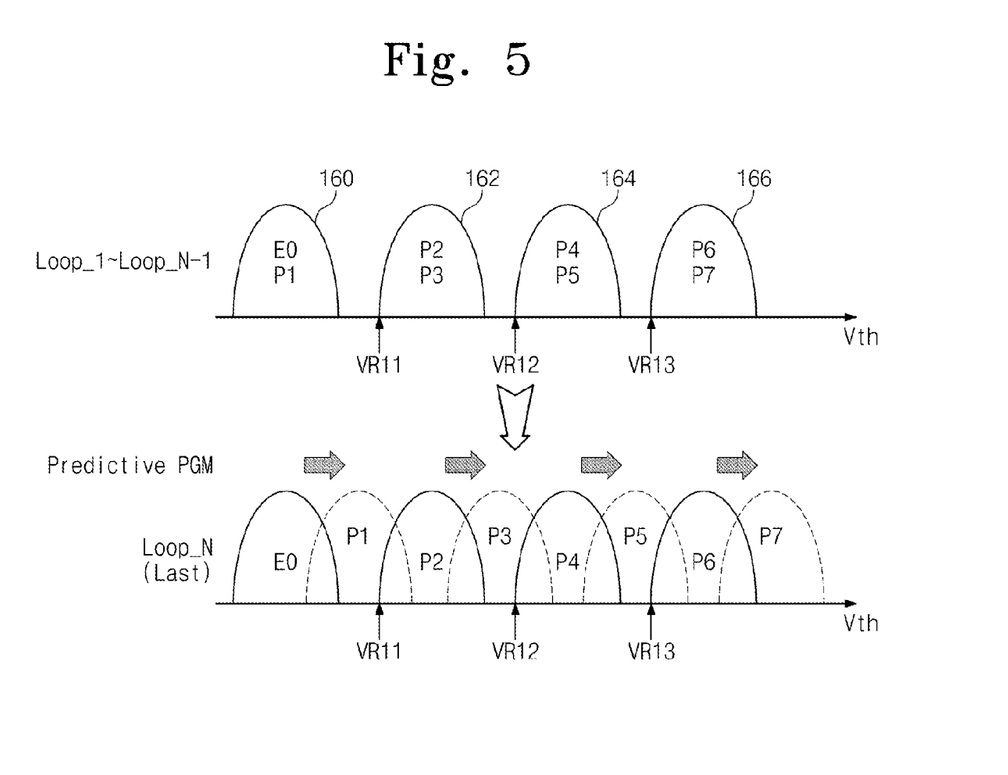
FIG. 5 is a graph illustrating threshold voltage distributions for memory cells programmed by a method according to an of the inventive concept.

FIG. 5 shows a first-step reprogram operation according to an embodiment of the inventive concept.

Referring to FIG. 5, a predictive program operation is performed in the last loop of the first-step reprogram operation.

In a first-step reprogram operation, selected memory cells are classified into four groups by 2-bit data loaded by a page buffer circuit. For example, the selected memory cells may be classified into four target states 160, 162, 164, and 166 according to a bit value stored in latch A and latch B. In addition, a program-verify procedure is repeated by the loop N−1 of the first-step program operation to have a threshold voltage distribution corresponding to four states 160, 162, 164, and 166. In this case, whether a program to four target states 160, 162, 164, and 166 is completed is detected by verify voltages VR11 to VR13 provided to selected memory cells.

If it is verified that the selected memory cells are program-completed to each of the four target states 160, 162, 164, and 166, a last loop N of the first-step re-program operation is performed. In this case, latch C of a page buffer circuit is referenced. It is determined according to a logic value of latch C whether each of the selected memory cells is a predictive program cell or a program inhibit cell.

If the logic value of each of latch A and latch B is logic '1' and the logic value of latch C is logic '1', a selected memory cell is able to be set to program inhibit from predictive program. As a result of the predictive program, a selected memory cell is maintained in an erase state E0. On the other hand, if the logic value of each of latch A and latch B is logic '1' and the logic value of latch C is logic '0', a selected memory cell is set to be programmed to state P1 in predictive program. That is, in the last loop N of the first-step reprogram operation, the bit line of a selected memory cell is able to be set up as 0V. If a predictive program is performed, a selected memory cell is programmed to state P1. Data of latch C is forcibly set to logic '1' before program-verify operations in predictive program. Thus, the latches of page buffer 130 need to be set to be able to be determined as verify-pass unconditionally in the last program loop N even if verify-read operations are performed.

Figure 6:
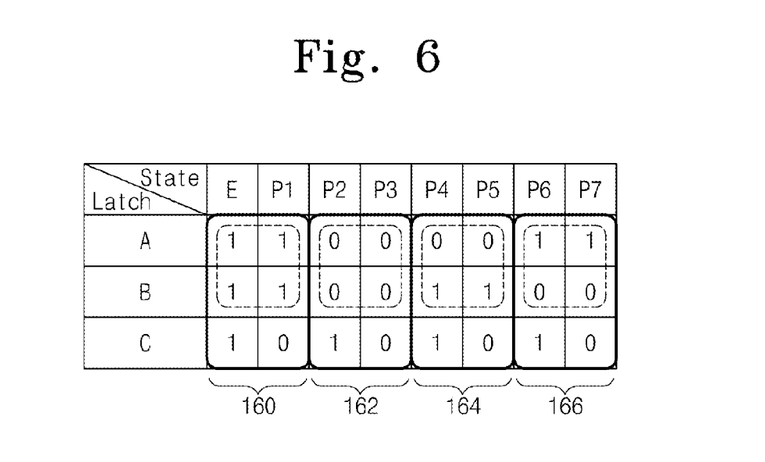
FIG. 6 is a table illustrating data values of latches in a page buffer circuit according to an embodiment of the inventive concept.

FIG. 6 is a table of latch values in a page buffer circuit according to an embodiment of the inventive concept.

Referring to FIG. 6, in a first-step reprogram operation, one selected memory cell is determined as any one of four groups 160, 160, 164, and 166 according to logic values of latch A and latch B of the page buffer circuit. In addition, a predictive program is performed based on the logic value of latch C.

A group applied in a first step of memory cells is identified according to the logic values stored in latch A and latch B. For example, if the logic values stored in latch A and latch B are logic '11', a first group 160 may be assigned. If the logic values stored in latch A and latch B are logic '00', a second group 162 may be assigned. If the logic values stored in latch A and latch B are logic '01', a third group 164 is assigned. If the logic values stored in latch A and latch B are logic '10', a fourth group 166 is assigned. A verify operation occurs on a group basis by the loop N−1 of the first-step reprogram operation. Thus, verify-read operations on a second group of memory cells 162 can be performed using verify voltage VR11. Verify-read operations on a third group of memory cells 164 can be performed using verify voltage VR12. Verify-read operations on a fourth group of memory cells 166 can be performed by verify voltage VR13.

In addition, if the verification of selected memory cells is completed by verify voltages VR11 to VR13, a predictive program is performed according to the logic value stored in latch C. For example, a predictive program for moving to state P1 later is applied to a memory cell which belongs to first group 160 but has logic '0' as the logic value of data stored in latch C. The predictive program operation is as follows. The bit line of a selected memory cell is setup according to a logic value stored in latch C. In addition, after a program voltage is applied, the logic value of latch C is reset to logic '1'. Through this setting, a predictive-programmed memory cell is forcibly set to program inhibit. Thus, the predictive program operation is the last loop of the first-step reprogram operation. Such a latch setting is equally applied to latch C of memory cells that are predictive-programmed as P3, P5, and P7.

Figure 7:
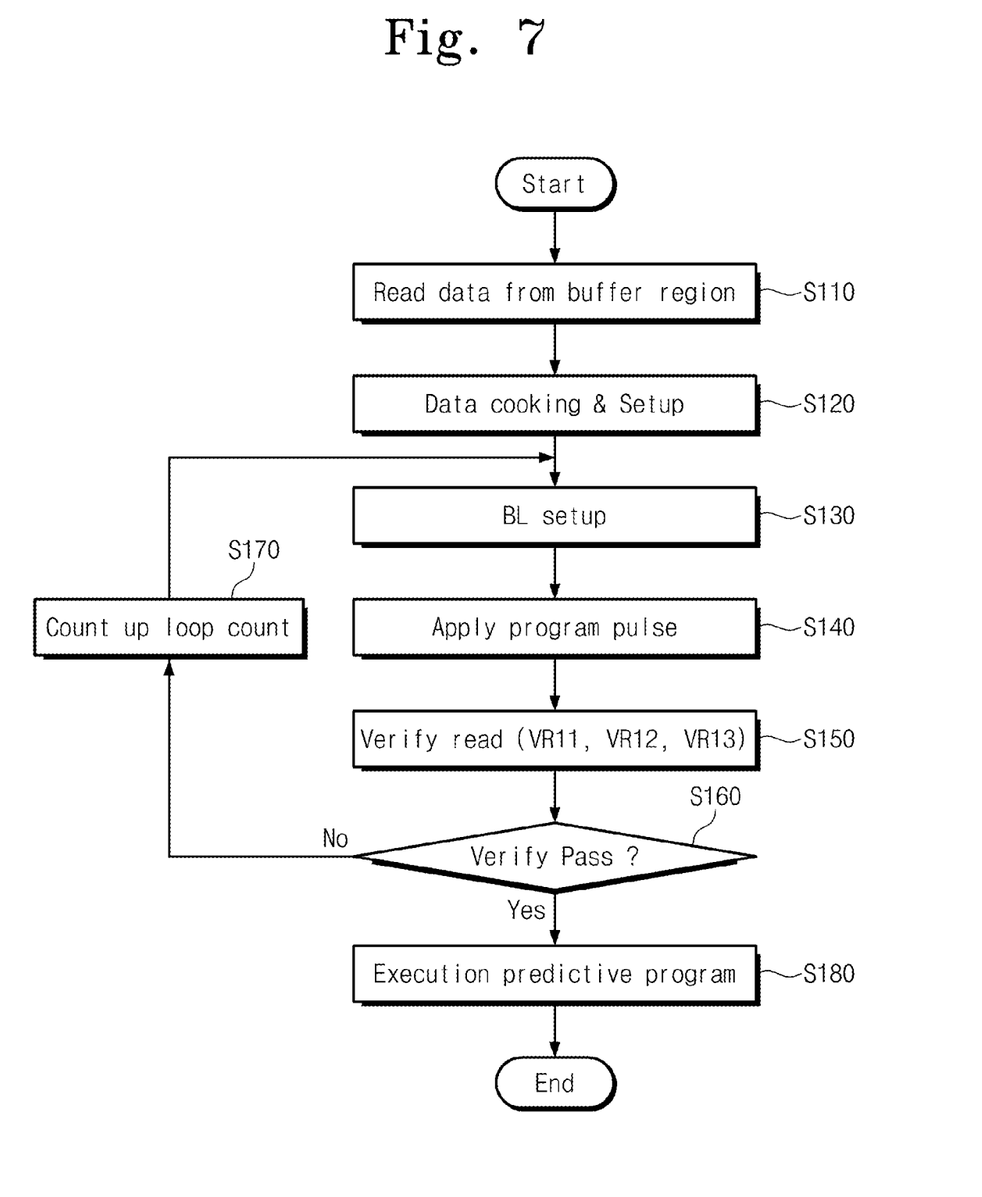
FIG. 7 is a flowchart illustrating a first-step reprogramming method according to an embodiment of the inventive concept.

FIG. 7 is a flowchart of a first-step reprogramming method according to an embodiment of the inventive concept.

Referring to FIG. 7, loops corresponding to operations programmed based on the logic values of latch A and latch B and a predictive program performed based on the logic value stored in latch C are included in the first-step reprogram operation.

In step S110, a read operation on buffer area 112 is performed. For example, if 3-page data is programmed through a main program, 3-page data to be reprogrammed is read from buffer area 112. In addition, read data is sequentially stored in the latches of page buffer 130.

In step S120, data cooking is performed. Data of latch A to latch C is arranged on the page buffer circuit by data cooking. Though data cooking, 3-bit data to be programmed is assigned to latch A to latch C. The data cooking is performed based on bit assignment to each of program states E0 and P1 to P7. That is, latches are set so that adjacent program states have only 1-bit difference.

In step S130, a bit line setup is performed for memory cells that are selected based on the logic values of latch A and latch B. For example, the bit line of memory cells corresponding to first group 160 of four groups 160, 162, 164, and 166 is set up to a voltage for a program inhibit operation. That is, the bit line of memory cells of which the target state is an erase state or a program state P1 is set up to a program-inhibit voltage (e.g., Vcc). On the other hand, the bit line of memory cells that are identified as other groups 162, 164 and 166 is able to be set to 0V.

In step S140, program voltage Vpgm is applied to the wordline of selected memory cells. In the first program loop, the lowest-level program pulse Vpgm1 is applied.

In step S150, following application of a program pulse, verify voltages VR11 to VR13 are applied to the wordline of selected memory cells.

In step S160, it is detected with reference to data read by each of the verify voltages VR11 to VR13 whether a program to selected memory cells is completed. If all data set to latch A and latch B by verify-read operations is logic '1', a program to each of the four groups is completed. In this case, the procedure will go to step S180. On the other hand, if all of latch A and latch B are not changed to logic '1' by verify-read operations, the procedure will go to step S170 for performing the following program loop.

In step S170, a loop count Loop_cnt is count up. In addition, the procedure returns to step S130 for performing a program operation corresponding to an increased loop count.

In step S180, a predictive program is performed with reference to the logic value of latch C. Namely, the threshold voltage of selected memory cells is maintained as program states E0, P2, P4, and P6 or move to program states P1, P3, P5 and P7, according to the logic value of latch C. In predictive program operation, a pulse is provided only once. In addition, in prediction program operation, a program-verify operation for determining a program result is skipped. The predictive program is described in more detail with reference to FIG. 8 below.

A first-step reprogram operation has been schematically described above. It is possible to form eight threshold voltage distributions through the predictive program that is performed in the first-step reprogram. Here, memory cells to be programmed to a program state P1 are able to employ a predictive program in the first loop of the first-step reprogram operation. Alternatively, memory cells to be programmed to a program state P1 may be controlled by using a bit line forcing scheme. The bit line forcing scheme means setting up a bit line to a voltage lower than a program inhibit voltage. It is possible to solve a program speed difference that occurs according to a size of a program pulse through such a separate control.

Figure 8:
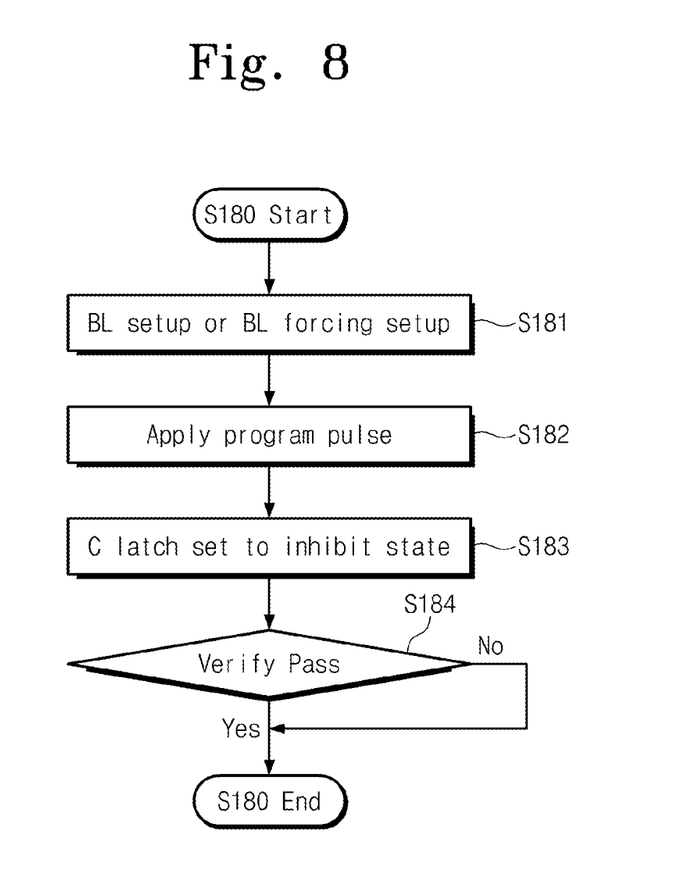
FIG. 8 is a flowchart of an operation in the method of FIG. 7, according to an embodiment of the inventive concept.

FIG. 8 is a detailed flowchart of step S180 in the method of FIG. 7, according to an embodiment of the inventive concept.

Referring to FIG. 8, the predictive program sets up a bit line with reference to data loaded to latch C, and forcibly sets the data of latch C to logic '1' before verify-read operations are performed. The predictive program may be performed during one-cycle program loop through such a procedure.

In step S181, a bit line setup is performed on memory cells in each of groups 160, 162, 164, and 166, according to the logic value of latch C of page buffer 130. That is, the bit line of memory cells which have logic '0' as the logic value of latch C among the first group of memory cells 160 may be setup to 0V. On the other hand, the bit line of memory cells which have logic '1' as the logic value of latch C among the first group of memory cells 160 may be setup to a program inhibit voltage (e.g., Vcc). Such a bit line setup is also applied to memory cells corresponding to other groups 162, 164, and 166. Here, a bit line voltage may also be provided by a bit line forcing scheme, to memory cells to be programmed to a target state P1 among the first group of memory cells 160.

In step S182, a program pulse is provided to the wordline of selected memory cells.

In step S183, a program inhibit setting is performed on latch C before a verify read operation starts.

In general, the logic value of latch C is toggled to logic '1' as a result of the program verify operation but in the predictive program according to an embodiment of the inventive concept, the data value of latch C is forcibly converted into logic '1' to set latches to program success unconditionally.

In step S184, a verify read operation is performed. For example, the verify voltages VR11 to VR13 are provided and sensing is performed on selected memory cells. However, because the logic value of latch C is already set to logic '1', the verify read operation in the predictive program by verify voltages VR11 to VR13 is determined as program pass unconditionally. Thus, the predictive program operation will end irrespective of the result of verify read.

Here, steps S183 and S184 correspond to dummy verify operations that are performed in the predictive program operation. That is, the verify voltages VR11 to VR13 are provided to selected memory cells. However, selected memory cells are considered as verify pass by the dummy verify operation irrespective of program completion.

Figure 9:
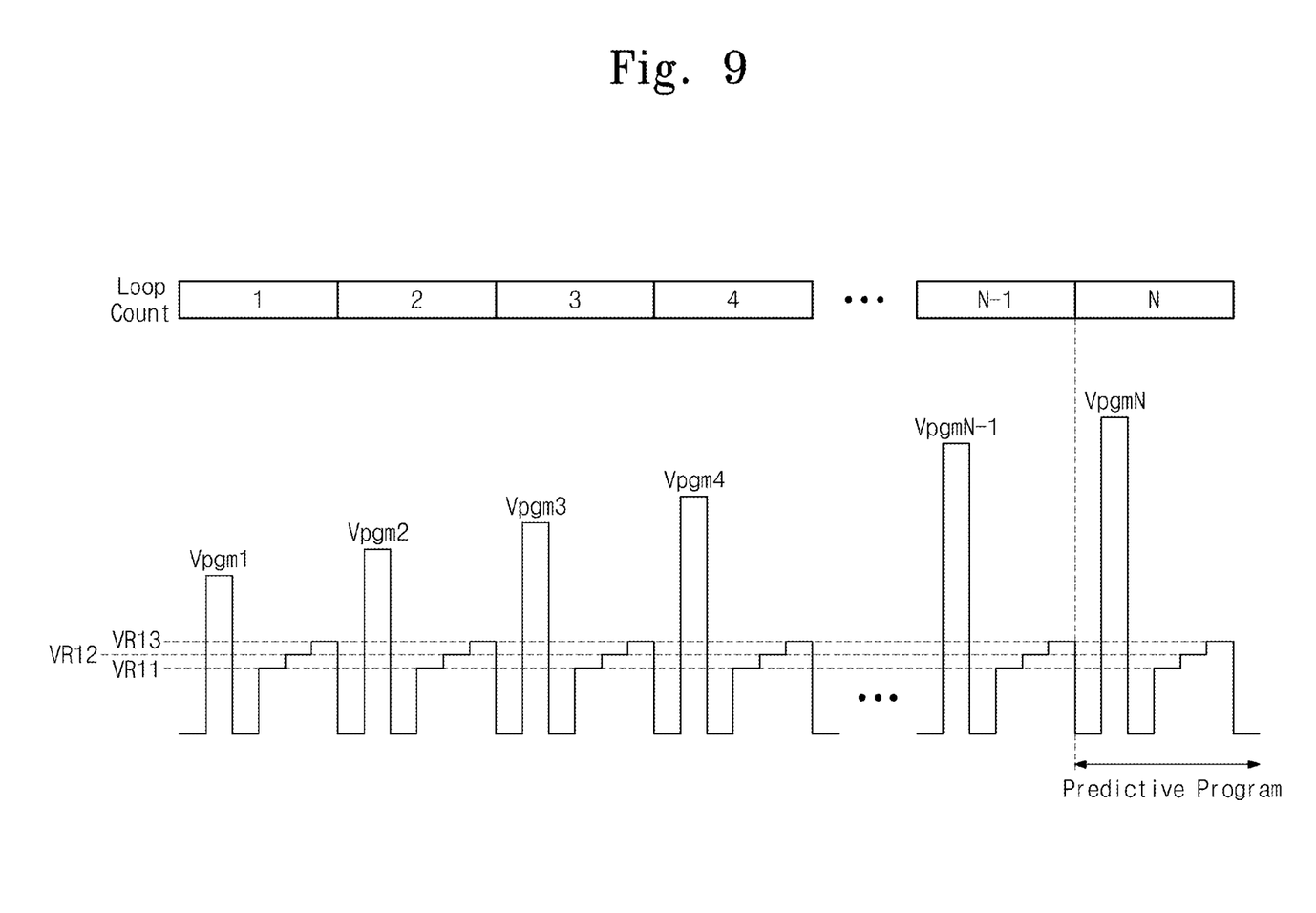
FIG. 9 is a waveform diagram of a wordline voltage in first-step reprogram operation, according to an embodiment of the inventive concept.

FIG. 9 is a waveform diagram of a wordline voltage in first-step reprogram operation according to an embodiment of the inventive concept.

Referring to FIG. 9, the level of a verify voltage provided in first-step reprogram operation corresponds to four target states. However, it is possible to form eight target states through a predictive program corresponding to the last loop.

In program operation, a program voltage VpgmN and following verify voltages VR11 to VR13 are provided in each loop (Loop_cnt). Here, the level of the verify voltages provided every loop is just an example that is applied in the '8-8-8' reprogram scheme. If such program loops are repeated and the threshold voltage of selected memory cells is determined as verify pass for each of the verify voltages VR11 to VR13, the last program loop (Loop count N) is performed. The last program loop corresponds to a predictive program.

A program voltage VpgmN is applied to selected memory cells in a predictive program. In addition, before a verify read operation is performed, the logic value of latch C is forcibly set to logic '1'. Then, the result of verify read in the predictive program is determined as verify pass unconditionally. That is, a verify voltage for the verify read operation is provided but the predictive program substantially ends irrespective of the result of the verify read operation. That is, the verify operation that is performed in the predictive program corresponds to a dummy verify operation. Through such a predictive program, the threshold voltage distributions of memory cells will increase from four states to eight states.

Figure 10:
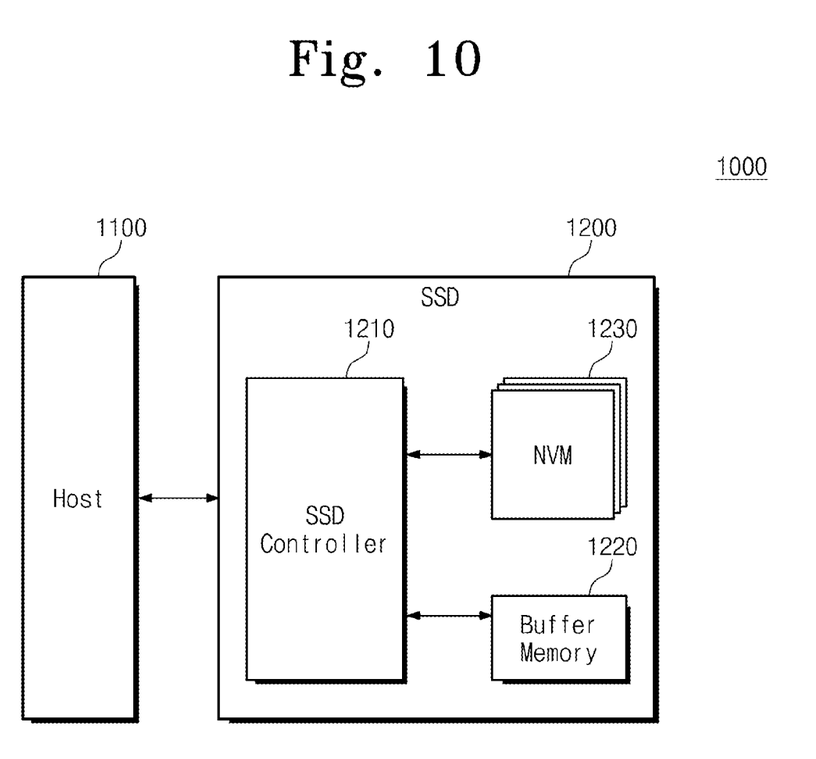
FIG. 10 is a block diagram of a user device comprising a solid state drive (SSD), according to an embodiment of the inventive concept.

FIG. 10 is a block diagram of a user device 1000 comprising an SSD, according to an embodiment of the inventive concept.

Referring to FIG. 10, user device 1000 comprises a host 1100 and an SSD 1200. SSD 1200 comprises an SSD controller 1210, a buffer memory 1220, and a nonvolatile memory device 1230.

SSD controller 1210 provides a physical connection between host 1100 and SSD 1200. That is, SSD controller 1210 provides an interface between host 100 and SSD 1200 according to the bus format of host 1100. In particular, SSD controller 1210 decodes a command provided from host 1100. According to a decoded result, SSD controller 1210 accesses nonvolatile memory device 1230. The bus format of host 1100 may include a universal serial bus (USB), a small computer system interface (SCSI), PCI express, ATA, parallel ATA (PATA), serial ATA (SATA), serial attached SCSI (SAS), etc.

Buffer memory 1220 temporarily stores write data provided form host 1100 or data read from nonvolatile memory device 1230. When data present in nonvolatile memory device 1230 is already cached if there is a read request from host 1100, buffer memory 1220 supports a cache function that provides cashed data directly to host 1100. In general, a data rate using the bus format (e.g., SATA or SAS) of host 1100 is extraordinarily faster than that of a memory channel of SSD 1200. That is, if the interface speed of host 1100 is extraordinarily higher, it is possible to minimize a performance decrease due to a speed difference by providing a mass buffer memory 1220.

Nonvolatile memory device 1230 is provided as a storage medium of SSD 1200. For example, nonvolatile memory device 1230 may be provided as a NAND-type flash memory that has a mass storage capacity. Nonvolatile memory device 1230 may include multiple memory devices. In this case, each memory device is connected to SSD controller 1210 on a channel basis. Nonvolatile memory device 1230 is substantially the same as nonvolatile memory device 100 of FIG. 1. That is, nonvolatile memory device 1230 may form eight distributions in first-step reprogram operation of a main program. Thus, nonvolatile memory device 1230 may provide a high program speed or high data integrity.

Although nonvolatile memory device 1230 as a storage medium is described by using a NAND-type flash memory, it may include other nonvolatile memory devices. For example, a PRAM, an MRAM, a ReRAM, an FRAM, a NOR flash memory, etc. may be used as the storage medium and a memory system in which heterogeneous memory devices are used may also be applied. Nonvolatile memory device 1230 comprises a buffer area for a buffer program operation and a main area for a main program operation.

The nonvolatile memory device and/or the memory controller according to the inventive concept may be mounted by using packages of various forms. For example, the flash memory device and/or the memory controller according to the inventive concept may be mounted by using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in wafer Form, Chip On Board (COB), Ceramic Dual In-Line Package (CERDIP), Plastic Metric Quad Flat Pack (MQFP), Thin Quad Flatpack (TQFP), Small Out line (SOIC), Shrink Small Outline Package (SSOP), Thin Small Out line (TSOP), System In Package (SIP), Multi Chip Package (MCP), Wafer-level Fabricated Package (WFP), Wafer-Level Processed Stack Package (WSP).

A nonvolatile memory device according to certain embodiments of the inventive concept may decrease the number of program pulses required in reprogram operation and thus increase a program speed. Also, a nonvolatile memory device according to certain embodiments of the inventive concept may use time corresponding to the decrease of the program pulse for improving distributions and thus enhance a read margin.

The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined in the claims.

What is claimed is:

1. A method of reprogramming a nonvolatile memory device, comprising:
    setting up bit lines of selected memory cells according to logic values of first and second latches of a page buffer connected to the bit lines;
    supplying a program pulse to the selected memory cells;
    performing a program verify operation on the selected memory cells using the first and second latches; and
    performing a predictive program operation on the selected memory cells according to a result of the program verify operation,
    wherein in the predictive program operation, bit lines of the selected memory cells are setup according to a logic value of a third latch of the page buffer that corresponds to each of the selected memory cells.

2. The method of claim 1, wherein during performing the program verify operation, verify voltages provided to wordlines of the selected memory cells are provided as three different levels.

3. The method of claim 1, wherein during the program verify operation, verify voltages provided to wordlines of the selected memory cells are provided based on multiple groups that are identified by logic values stored in the first and second latches.

4. The method of claim 1, wherein the predictive program operation is performed after the selected memory cells are determined as verify pass in the program verify operation.

5. The method of claim 1, wherein during the predictive program operation, a verify operation on the selected memory cells is forcibly set to verify pass irrespective of program completion.

6. The method of claim 1, wherein the predictive program operation comprises:
    setting up a bit line of each of the selected memory cells according to a logic value of the third latch;
    supplying a program pulse to the selected memory cells; and
    resetting the logic value of the third latch to a program inhibit value.

7. The method of claim 6, wherein in setting up the bit line, a bit line forcing voltage lower than a program inhibit voltage is provided to bit lines of memory cells that are programmed from an erase state to a program state.

8. The method of claim 6, further comprising performing a dummy verify operation on the selected memory cells where the resetting is completed.

9. The method of claim 8, wherein in the dummy verify operation, determination is made as verify pass irrespective of whether a program to the memory cells is completed.

10. The method of claim 1, further comprising reading two-or-more-page data loaded to first to third latches of the page buffer, from memory cells of a buffer area.

11. The method of claim 1, wherein the method is performed during a first step of a multi-step reprogram operation used to program at least 3-bit data in the selected memory cells.

12. The method of claim 11, wherein the predictive program operation corresponds to a last loop of the multi-step reprogram operation.

13. A nonvolatile memory device comprising:
 a cell array comprising a buffer area and a main area, wherein data stored in the buffer area is written to the main area by multiple reprogram steps;
 a row decoder configured to select a wordline of the cell array according to a row address;
 a page buffer configured to store two-or-more-page data read from the buffer area, wherein the page buffer writes the two-or-more-page data to selected memory cells of the main area based on the reprogram steps; and
 control logic configured to control the row decoder and the page buffer to perform a verify operation with reference to first-page and second-page data and to program three-or-more-page data with reference to third-page data in a first of the reprogram steps.

14. The nonvolatile memory device of claim 13, wherein the control logic controls the page buffer to setup bit lines of the selected memory cells according to the third-page data where a determination is made as verify pass in the verify operation performed with reference to first-page and second-page data.

15. The nonvolatile memory device of claim 14, wherein the page buffer sets latches storing the third-page data to a program inhibit state irrespective of program completion, after the selected memory cells are programmed according to the third-page data.

16. The nonvolatile memory device of claim 13, wherein the control logic further controls a predictive program operation of the selected memory cells according to a result of the verify operation, wherein in the predictive program operation, bit lines of the selected memory cells are setup according to a logic value of a third latch of the page buffer that corresponds to each of the selected memory cells.

17. The nonvolatile memory device of claim 16, wherein the predictive program operation comprises:
 setting up a bit line of each of the selected memory cells according to a logic value of the third latch;
 supplying a program pulse to the selected memory cells; and
 resetting the logic value of the third latch to a program inhibit value.

18. The nonvolatile memory device of claim 17, wherein in setting up the bit line, a bit line forcing voltage lower than a program inhibit voltage is provided to bit lines of memory cells that are programmed from an erase state to a program state.

19. The nonvolatile memory device of claim 17, wherein a dummy verify operation is performed on the selected memory cells after the resetting is completed.

20. The nonvolatile memory device of claim 19, wherein in the dummy verify operation, a determination is made as verify pass irrespective of whether a program to the memory cells is completed.

* * * * *